United States Patent [19]

Capp, Michael L. et al.

[11] Patent Number: 5,113,315

[45] Date of Patent: May 12, 1992

[54] HEAT-CONDUCTIVE METAL CERAMIC COMPOSITE MATERIAL PANEL SYSTEM FOR IMPROVED HEAT DISSIPATION

[75] Inventors: Capp, Michael L.; Arthur O. Capp, Jr., both of Zion, Ill.

[73] Assignee: Cirqon Technologies Corporation, Gurnee, Ill.

[21] Appl. No.: 563,491

[22] Filed: Aug. 7, 1990

[51] Int. Cl.$^5$ .............................................. H05K 7/20
[52] U.S. Cl. .................... 361/386; 361/387; 361/388; 361/389; 361/383; 165/80.3; 165/185; 357/81; 357/80; 174/16.3
[58] Field of Search ............... 361/383, 386, 387, 388, 361/389, 414; 165/80.3, 185; 357/81, 80; 174/16.3

[56] References Cited

PUBLICATIONS

IBM Technical Disclosure Bulletin, Berndlmaier et al., Multilayer Metal Substrate Package, Mar. 1980, vol. 22 No. 10, pp. 4518-4520.
IBM Technical Disclosure Bulletin, Mandel et al., Heat Dissipator Assemblies, Mar. 1966, vol. 8, No. 10, pp. 1460-1461.
IBM Technical Disclosure Bulletin, Coles, Heat Sink, Jul. 1963, vol. 6 No. 2.

*Primary Examiner*—Leo P. Picard
*Assistant Examiner*—Young S. Whang
*Attorney, Agent, or Firm*—Dressler, Goldsmith, Shore, Sutker & Milnamow, Ltd.

[57] ABSTRACT

For use as a substrate for a heat generating microelectronic integrated circuit, a ceramic panel is provided having small thickness in comparison to its length and breadth, having on at least the surface opposite the one bearing the microelectronic integrated circuit, a layer of heat conductive metal and having a plurality of closely spaced, small cross section extensions of the heat conductive metal layer extending into the ceramic material to a depth of at least about one fifth of its thickness. The substrate is particularly useful for the mounting of hybrid microelectronic circuits to improve the heat dissipation capability of the ceramic substrate.

26 Claims, 4 Drawing Sheets

HEAT-CONDUCTIVE METAL CERAMIC COMPOSITE MATERIAL PANEL SYSTEM FOR IMPROVED HEAT DISSIPATION

TECHNICAL FIELD

This invention relates to ceramic panels suitable as substrates for integrated microelectronic circuits and other microelectronic devices which generate heat in particular to ceramic panels having a metallic, integral heat transport system. A method of manufacturing such panels is also disclosed.

BACKGROUND OF THE INVENTION

Hybrid microelectronic circuitry, the heart of which is the integrated circuit, or I.C. chip, is finding wider and wider application every year. The most visible application is in computer electronics where ever increasing demands for improved performance have pushed the power, density and speed demands on integrated circuit chips higher and higher. Less visible, but growing even faster is the miniature electronic circuitry used in the telecommunications, consumer electronics, automotive electronics industries and in medical applications and aircraft and space technology. Such integrated circuit chips are commonly mounted on ceramic panels, or substrates.

In use, when the integrated circuit chip is energized, it generates heat which, if not properly transferred away from the chip, can be detrimental thereto. The problem is exacerbated because most electrical insulators, or non-conductors are also poor conductors of heat. Aluminum oxide, for example, is strong and cheap and is an excellent electrical insulator, but has very poor thermal conductivity, less than about 0.06 calories per centimeter.second. ° C. (cal/cm.sec. ° C. ) in a temperature range of 0 to about 1125° C.

For some uses, where amperage is relatively high and/or where prolonged continuous usage is contemplated, integrated circuits are mounted on beryllium oxide or aluminum nitride substrates (which have better thermal conductivities) despite their being much more expensive than aluminum oxide. Beryllium oxide, for example, can be as much as a hundred times as expensive as aluminum oxide on a comparable size basis and may also involve toxicity problems.

Moreover, even beryllium oxide and aluminum nitride have thermal conductivities which are often insufficient to provide adequate heat transfer for some operations involving relatively high amperages.

SUMMARY OF THE INVENTION

In accordance with the present invention, there is provided in a panel suitable as a substrate for a heat generating microelectronic integrated circuit, which panel is of small thickness as compared to its length and breadth, has a major surface for accommodating said circuit and is composed of a ceramic material having dielectric properties, the improvement comprising a layer of heat conductive metal on the surface of said panel said circuit accommodating surface and a plurality of closely spaced, small cross-section extensions of said heat conductive metal layer, integral therewith and extending into said ceramic material to a depth of at least about one fifth of its thickness.

The invention finds its widest applicability in the improvement of ceramic substrates which are low in cost and which have very poor thermal conductivity, particularly substrates of aluminum oxide. For special purposes where heat generation may be severe, the invention may also be used for the improvement of more expensive ceramic substrates, such as beryllium oxide or aluminum nitride, which have relatively good thermal conductivities.

The heat conductive metal in the surface layer the microelectronic integrated circuit and in the closely spaced, small cross-section extensions is generally copper because of its excellent thermal conductivity and low cost. For some uses, copper alloys may be used. Where maximum heat transfer is desired and cost considerations are secondary, the heat conductive metal may be silver or a silver alloy.

The heat conductive metal in the surface layer opposite the microelectronic integrated circuit functions both as a heat sink and as a heat transfer means. Where the circuit functions for relatively brief periods separated by longer non-working periods, the heat conductive layer, by reason of its density and heat capacity may absorb and hold sufficient generated heat to enable the circuitry to function for its required functioning periods.

However, where more extended function periods are required, the heat conductive metal gives up its heat effectively by reason of its extended area for radiation, conduction and/or convection, as explained below.

The invention contemplates embodiments in which there is also a layer of heat conductive metal on the same side and under the microelectronic circuit, confined to the area of said circuit and having a plurality of closely spaced, small cross-section extensions extending into said ceramic material to a depth of at least about one fifth of its thickness.

It should be noted that extensions of conductive metal into the ceramic material of the substrate, whether from only the surface opposite the circuit-accommodating surface or from both surfaces reduce the effective thickness of the insulating, or dielectric material. However, in practice, the thickness of the ceramic material is generally governed by the adequacy of its physical strength, its ability to withstand repeated heating and cooling cycles, and in some cases its ability to withstand vibration. Such thickness is generally more than adequate to provide the necessary electrical insulation even after extensions of heat conductive metal into the ceramic material from one or both sides.

The thickness of the ceramic material substrate of this invention generally follows the present practice and is in the range of about 10 to about 80 mils. Extensions of the heat conductive metal, when only from the side opposite the circuit-accommodating surface can be up to about 80% of the thickness. When extensions from both sides are used, the extensions from each side can be up to about 45% of the thickness, but the extensions from each side need not be to equal depths.

The ceramic panel of this invention is made by providing a blank of ceramic material having dielectric properties and having small thickness as compared to its length and breadth, forming at at least one major surface of said blank, through lasering, a plurality of closely spaced holes of small cross-section extending into said ceramic material to a depth of at least about one fifth of its thickness, filling said holes with a heat conductive metal and coating said surface with a heat conductive metal to a thickness of at least about 0.5 mils.

The closely spaced holes are typically spaced no more than about 0.02 inches apart, providing about 25 holes in each 0.01 square inch. Preferably there are at least about 100 holes in each 0.01 square inch and most preferably at least about 200 holes in each 0.01 square inch.

The steps of filling the holes with a heat conductive metal and coating the surface of the ceramic material with a conductive metal are carried out by methods known in the art, such as by electroless deposition. Typical methods are disclosed in U.S. Pat. Nos. 3,993,799, 4,087,586, 4,220,678, 4,136,216, 4,199,623, 4,259,113 and 3,958,048 and in European Patent Publication 273227.

Usually, electroless deposition is followed by electrodeposition, performed in a conventional manner, so that the thickness of the conductive metal layer may be increased, as desired.

BRIEF DESCRIPTION OF THE DRAWINGS

In all of the FIGURES, corresponding elements bear the same numerical designation.

DETAILED DESCRIPTION OF THE INVENTION

Figure 1:
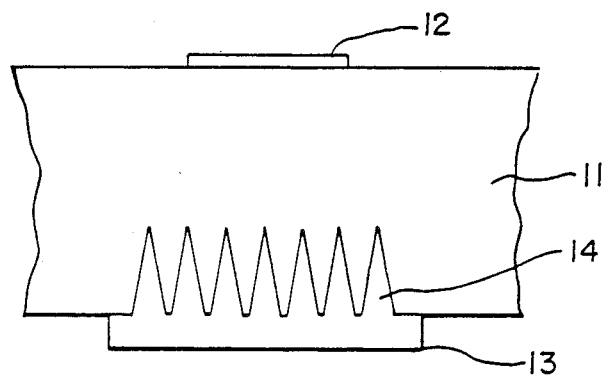
FIG. 1 is a fragmentary cross-sectional view of a portion of a microelectric chip panel having heat transfer means on one side thereof.

As may be seen in FIG. 1, ceramic panel, or substrate, 11 has, on one surface, a microelectronic chip 12, bonded to it in a conventional manner. On its opposite surface there is a layer of thermally conductive metal 13, typically copper and typically in a thickness of about 0.5 to 10 mils. Projecting from the conductive metal layer and integral therewith are extensions 14 which penetrate the ceramic material of the panel to a depth of at least about one fifth of the thickness of the panel and preferably at least about one third of the panel thickness. The spacing and width of extensions 14 are not shown to scale in the FIGURES and are actually much narrower and much more closely spaced.

Typically, extensions 14 are circular in cross section and range in diameter from about 4 to about 20 mils at the surface proximal to the layer of conductive material. In any one panel, the extensions are generally of the same diameter, although they need not be.

When the microelectronic chip is active and generating heat, a portion of the heat will not have to pass through the entire thickness of the poorly heat conductive ceramic material, but will encounter the ends of extensions 14 after passing through only a portion of the thickness. Such heat will thereafter be transferred rapidly to layer 13 with a greater heat capacity than the ceramic material and with an external surface capable of dissipating its heat content by conduction, convection and radiation.

Conductive layer 13 may be of substantially greater area than shown in FIG. 1 and heat transfer may be enhanced by a current of air or cooling gas, propelled by a blower.

Figure 2:
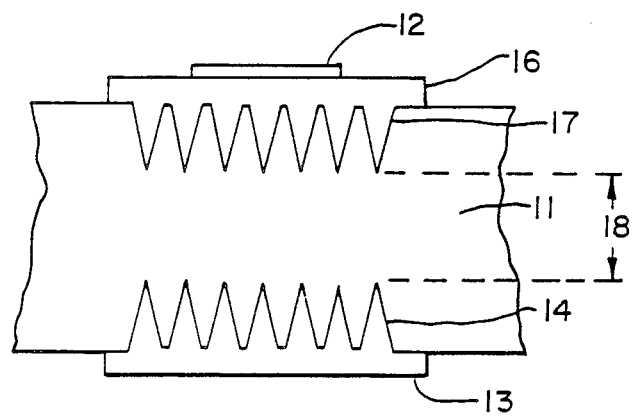
FIG. 2 is a fragmentary cross-sectional view of a portion of a microelectric chip panel having heat transfer means on both sides thereof.

The embodiment of FIG. 2 is generally similar to that of FIG. 1, except that microelectronic chip 12, instead of being attached directly to ceramic substrate 11, is attached to conductive metal layer 16 which has extensions 17, similar to extensions 14 from layer 13. The extensions 14 and 17 are not necessarily aligned with each other, as shown in FIG. 2, but in any case, there should be, in this embodiment, a thickness zone 18, into which there are no extensions from either conductive layer. Typically, thickness zone 18 is about one third the thickness of the substrate but may be thicker or thinner While conductive metal layer 13, as stated above, may be substantially more extensive in area than is shown in FIG. 2, conductive metal layer 16 must be limited in area to preserve the insulation of its microelectronic chip from other elements.

Figure 3:
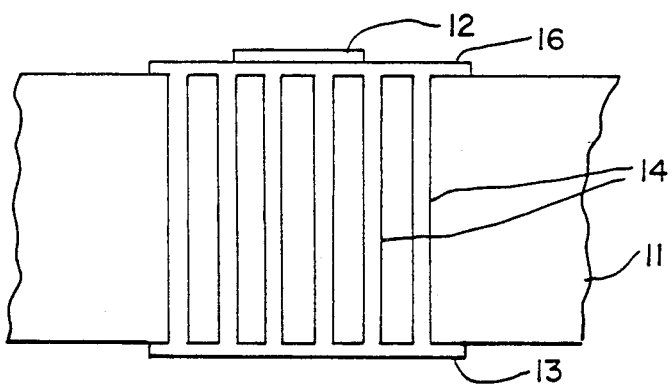
FIG. 3 is a fragmentary cross-sectional view of another embodiment of a microelectronic chip panel having heat transfer means both sides thereof.

In the embodiment of FIG. 3, there are also thermally conductive metal layers on both sides of the panel, but in this case extensions 14 extend through the entire thickness of the panel to provide a direct thermal (and electrical) connection between the two conductive layers.

In the FIG. 3 embodiment, both conductive layers are limited in area so that electrical insulation of the microelectronic chip is preserved by the lateral displacement of conductive metal layers 13 and 16 from other elements.

Figure 4A:
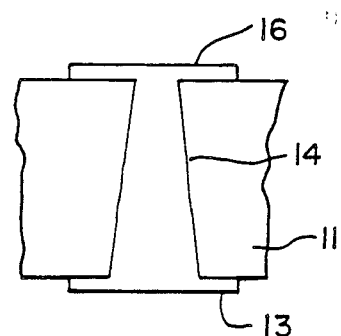
FIGS. 4A, 4B, and 4C are enlarged fragmentary cross sectional views of alternative profiles of passages from one surface to the opposite surface in modifications of the embodiment of FIG. 3.
Figure 4B:
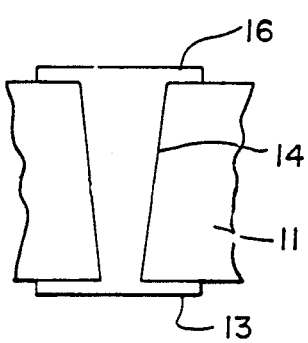
Figure 4C:
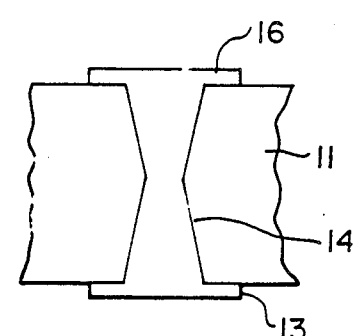

As shown in FIGS. 4A, 4B, and 4C, extensions 14 of FIG. 3 need not be cylindrical, as shown therein. In FIG. 4A, an extension is shown which is frustoconical in shape with its greater diameter at conductive layer 13. This is achieved by producing the holes for extensions 14 by laser entry through the surface to be coated by layer 13 and utilizing known laser drilling techniques.

Similarly, the hole shape of FIG. 4B can be achieved by laser entry through the surface to be coated by conductive metal layer 16 and the hole shape of FIG. 4C can be achieved by laser entry through both surfaces.

Figure 5:
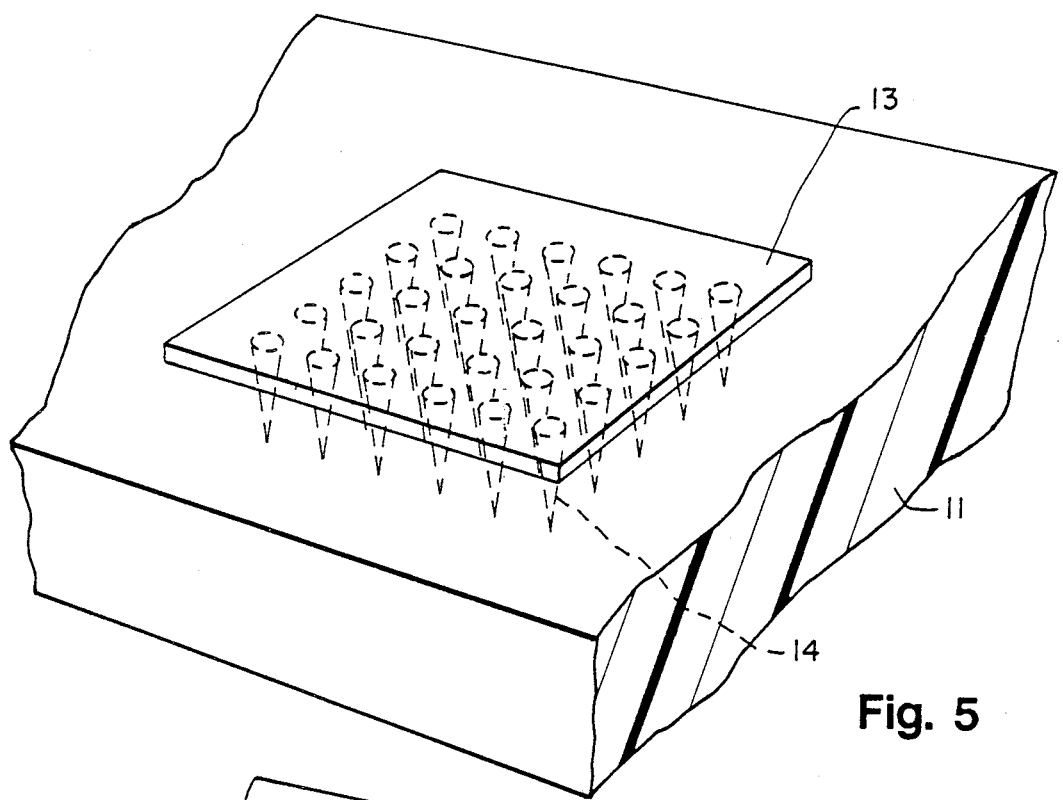
FIG. 5 is a fragmentary perspective view of a microelectronic chip panel having heat transfer means on one side thereof, as viewed from the side having the heat transfer means.

FIG. 5 is a perspective view of the embodiment of FIG. 1, except that it is viewed from the side containing the conductive metal layer and that microelectronic chip 12 is not shown in the interest of clarity. As in FIG. 1, the size and spacing of extensions 14 are not to scale.

Figure 6:
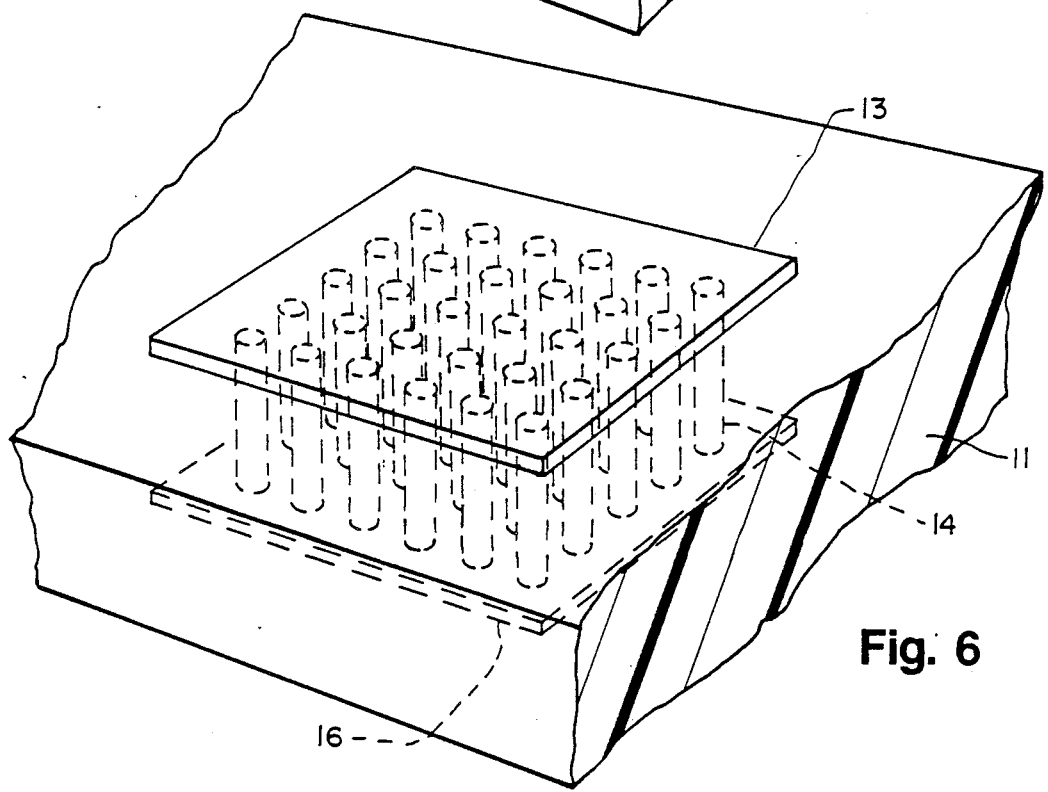
FIG. 6 is a fragmentary perspective view of another embodiment of a microelectronic chip panel having heat transfer means on both sides thereof.

FIG. 6 is a perspective view of the embodiment of FIG. 3, except that microelectronic chip 12 has been omitted in the interest of clarity.

Figure 7:
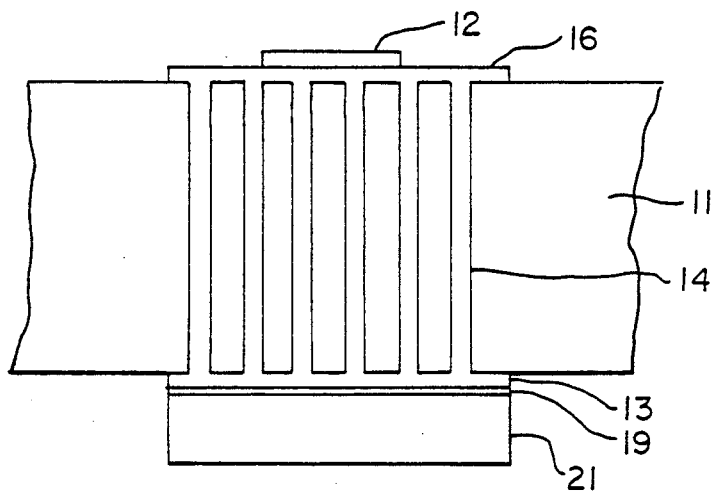
FIG. 7 is a fragmentary cross-section view of a modification of the embodiment of FIG. 3 to enhance its heat sink capacity.

FIG. 7 adds to the embodiment of FIG. 3, layer 19 of a brazing solder and plate 21 which is a heat sink of substantially greater weight and thickness as compared to conductive metal layer 13.

The material of heat sink 21 is generally metallic and is selected to be one which has a coefficient of expansion close to that of ceramic panel 11. Suitable materials include copper, silver, and metal combinations of copper/tungsten, silver/tungsten, copper molybdenum, silver/molybdenum, copper/molybdenum/copper and copper/invar/copper, either as discrete metal layers or as alloys.

Figure 8:
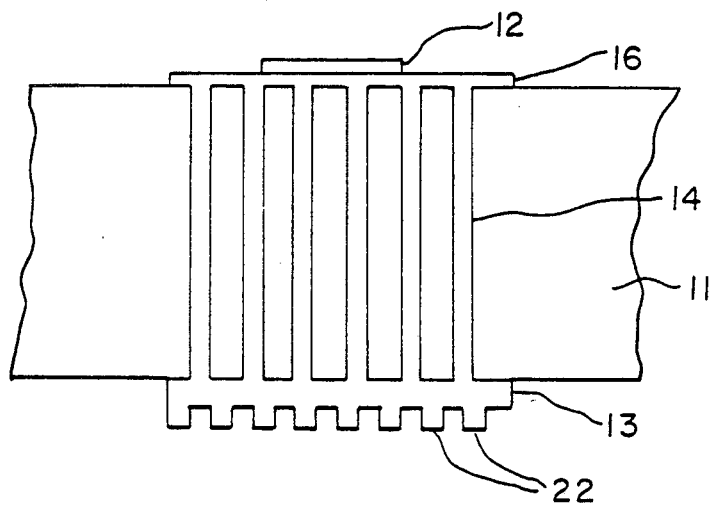
FIG. 8 is a fragmentary cross-section view of another modification of the embodiment of FIG. 3 to enhance its heat transfer ability.

The embodiment of FIG. 8 is also a variation of the embodiment of FIG. 3, except that, in this case, fins 22 are added to conductive metal layer 13 to enhance heat dissipation by radiation or by convection. For heat removal by convection, a blower may be used for maximum effect.

Fins 22 may be added, in the embodiment of FIG. 8, for example, by cutting parallel grooves into the thickness of conductive metal layer 13, or, preferably, by adhering thereto a separate prefabricated metallic element containing the grooves.

In place of grooves, dimples or holes may be provided on the outer surface of conductive metal layer 13 to increase the surface area.

Figure 9:
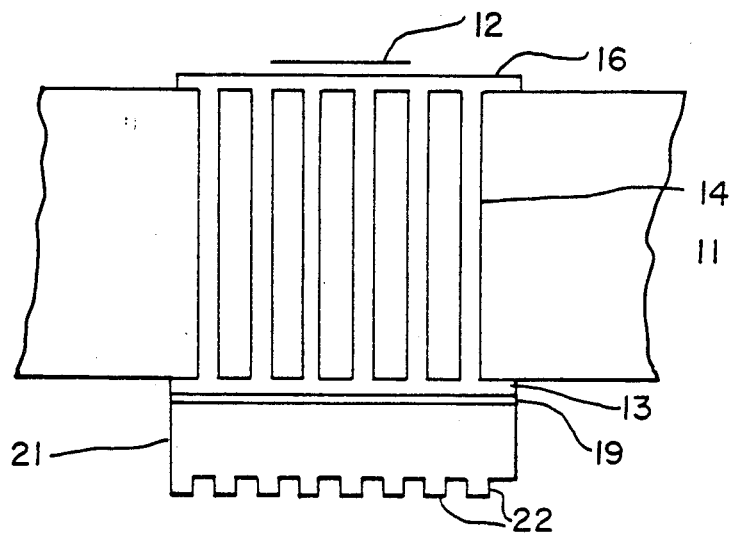
FIG. 9 is a fragmentary cross-section view of a modification of the embodiment of FIG. 7 to add heat transfer enhancement to its heat sink capacity.

The embodiment of FIG. 9 contains both an enlarged heat sink 21 (as in FIG. 7) and fins 22 (as in FIG. 8) to provide for both a greater heat sink and enhanced heat transfer.

Figure 10:
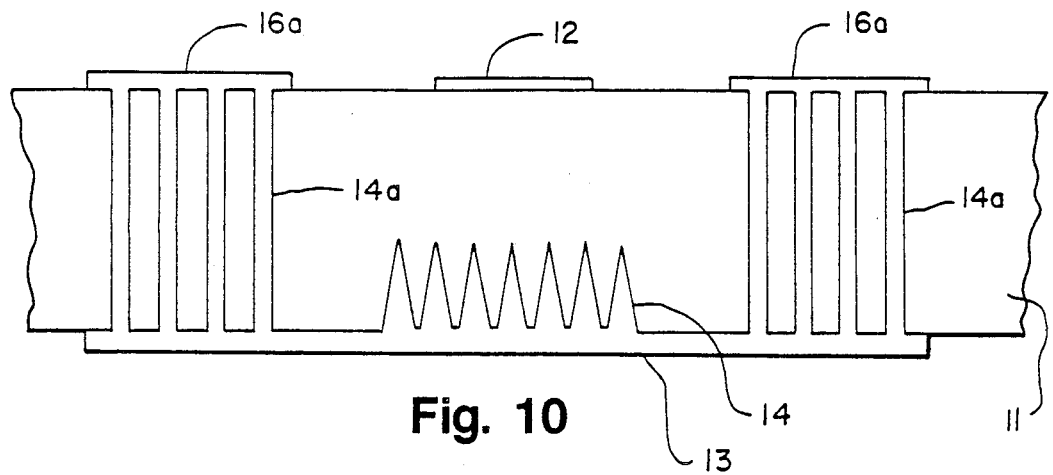
FIG. 10 is a fragmentary cross-section view of another embodiment of the invention in which there are heat transfer means on both sides of the panel, but only in an area outside and displaced from the microelectronic on the side bearing the chip.
Figure 11:
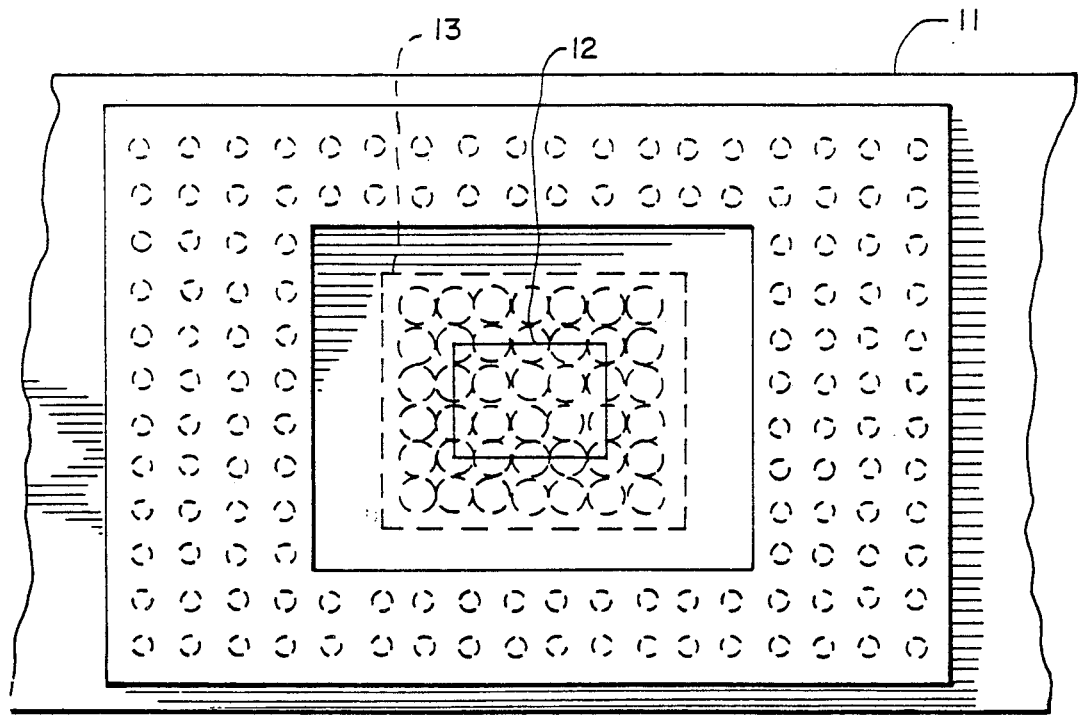
FIG. 11 is a fragmentary plan view of the embodiment of FIG. 10.

FIGS. 10 and 11 show an embodiment which is an improvement over that of FIG. 1. As in FIG. 1, there is conductive layer 13 directly under microelectronic chip 12 and on the opposite side of the ceramic panel. In this case, layer 13 extends laterally to underlie thermally conductive metal layer 16a, separated from chip 12 by a space adequate to provide electrical isolation. Layer 16a is connected to layer 13 by extensions 14a. This structure can provide substantially faster heat transfer away from the microelectronic chip than the structure of FIG. 3.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure as those skilled in the art will appreciate.

We claim:

1. In a ceramic panel suitable as a substrate for a heat generating microelectronic integrated circuit, which said ceramic panel is of relatively smaller thickness as compared to its length and breadth, has a major surface for accommodating the circuit and is composed of a ceramic substrate material having dielectric properties, the improvement comprising a layer of heat conductive metal on the surface of said ceramic panel opposite the circuit accommodating surface and a plurality of closely spaced, small cross-section extensions of said heat conductive metal layer, integral therewith and extending into said ceramic substrate material to a depth of at least about one fifth of its thickness but not beyond its thickness.

2. The ceramic panel of claim 1 wherein said ceramic material is selected from the group consisting of aluminum oxide, aluminum nitride, and beryllium oxide.

3. The ceramic panel of claim 1 wherein said heat conductive metal is selected from the group consisting of copper, copper alloys, silver and silver alloys.

4. The ceramic panel of claim 1 wherein said extension are circular in cross section.

5. The ceramic panel of claim 4 wherein said extensions are uniform in diameter throughout their depth.

6. The ceramic panel of claim 4 wherein said extensions are larger in diameter at the surface of said ceramic panel proximal to said layer of heat conductive metal.

7. The ceramic panel of claim 4 wherein said extensions have a diameter from about 4 to about 20 mils at the surface of said ceramic panel proximal to said layer of conductive material.

8. The ceramic panel of claim 1 wherein there are at least about 25 extensions within an area of 0.01 square inches on at least a portion of said ceramic panel.

9. The ceramic panel of claim 8 wherein there are at least about 100 extensions within an area of 0.01 square inches on at least a portion of said ceramic panel.

10. The ceramic panel of claim 1 wherein at least one of said extensions extend into said ceramic material to a depth between about 20% and about 80% of the thickness of said ceramic panel.

11. The ceramic panel of claim 1 wherein at least some of said extensions extend through the entire thickness of said ceramic panel.

12. In a ceramic panel suitable as a substrate for a heat generating microelectronic integrated circuit, which said ceramic panel is of relatively smaller thickness as compared to its length and breadth, has a major surface for accommodating the circuit and is composed of a ceramic substrate material having dielectric properties, the improvement comprising a layer of heat conductive metal on the surface of said ceramic panel opposite the circuit accommodating surface and on the circuit accommodating surface, and a plurality of closely spaced, relatively small cross-section extensions of said heat conductive metal layer, integral with both of said layers of the heat conductive metal and connecting said layers to each other; at least some of said extensions extending into said ceramic substrate material from the respective heat conductive metal layer to a depth between about 20% and about 80% of the thickness of said ceramic panel.

13. The ceramic panel of claim 12 wherein at least some of the extensions from each side extend into said ceramic material to a depth between about 20% and about 45% of the thickness of said ceramic panel.

14. The ceramic panel of claim 1 wherein said extensions are essentially conical.

15. The ceramic panel of claim 1 wherein said extensions are essentially cylindrical.

16. The ceramic panel of claim 1 wherein said layer of heat conductive metal is attached to a metallic plate of greater weight and thickness than said layer.

17. The ceramic panel of claim 1 wherein means are provided to increase the surface area of said layer of heat conductive metal.

18. The ceramic panel of claim 1 wherein heat conductive layers are provided on both the chip accommodating surface and the surface opposite surrounding said microelectronic integrated circuit and being laterally separated therefrom by space adequate for electrical insulation, said heat conductive metal layers being connected to each other by a plurality of closely spaced, small cross section extensions of said heat conductive layers.

19. A method of preparing a panel suitable as a substrate for a heat generating integrated circuit and suitable for effectively transferring said heat away from said circuit which comprises:
 a) providing a blank made of a ceramic material having dielectric properties and having a relatively small thickness as compared to its length and breadth,
 b) forming at at least one major surface of said blank, through lasering, a plurality of closely spaced holes of small cross-section extending into said ceramic material to a depth of at least about one fifth of its thickness but not beyond its thickness,
 c) filling said holes with a heat conductive metal, and
 d) coating said surface with a heat conductive metal to a thickness of at least about 0.5 mils.

20. The method of claim 19 wherein said ceramic material is selected from the group consisting of aluminum oxide, aluminum nitride and beryllium oxide, and said heat conductive metal is selected from the group consisting of copper and silver and their alloys.

21. The method of claim 19 wherein said holes are spaced so that there are at least about 100 holes within an area of 0.01 square inches on at least a portion of said surface.

22. The method of claim 19 wherein said holes penetrate said ceramic material to a depth from about 20% to about 80% of the thickness of said panel.

23. A ceramic blank for a panel suitable as a substrate for a heat generating integrated circuit, said blank being suitable for enhancement of its heat transfer properties, which blank comprises an article made of a ceramic material having dielectric properties, having two major parallel surfaces and having a relatively small thickness as compared to its length and breadth, said article having, on at least one major surface thereof, at least about 25 closely spaced holes within an area of 0.01 square inches, said holes being spaced no more than about 0.02 inches apart on either major surface and extending to a depth of at least about one fifth of the thickness of said article.

24. The ceramic blank of claim 23 wherein said holes extend through the entire thickness of said article.

25. The ceramic blank of claim 23 wherein said article has at least about 100 closely spaced holes within an area of 0.01 square inches.

26. The ceramic blank of claim 23 wherein said article has at least about 25 closely spaced holes within an area of 0.01 square inches on both major surfaces.

* * * * *